United States Patent [19]

Monma et al.

[11] 4,422,038

[45] Dec. 20, 1983

[54] INTEGRATED CIRCUIT WITH FREQUENCY-DIVIDING CIRCUITS CAPABLE OF BEING TESTED AT A HIGH SPEED

[75] Inventors: Hideo Monma, Kawasaki; Masayuki Takahashi, Utsunomiya; Masato Ishiguro, Kawasaki, all of Japan

[73] Assignee: Fujitsu Limited, Kawasaki, Japan

[21] Appl. No.: 237,152

[22] PCT Filed: Jun. 19, 1980

[86] PCT No.: PCT/JP80/00138

§ 371 Date: Feb. 18, 1981

§ 102(e) Date: Feb. 18, 1981

[87] PCT Pub. No.: WO80/02880

PCT Pub. Date: Dec. 24, 1980

[30] Foreign Application Priority Data

Jun. 19, 1979 [JP] Japan .................................. 54-77169

[51] Int. Cl.³ ...................... G01R 31/28; G01R 23/00; G04C 3/00

[52] U.S. Cl. ................................ 324/73 R; 324/78 R; 368/10

[58] Field of Search .................. 324/73 R, 73 AT, 56, 324/83 R, 83 D, 78 R, 78 D; 368/10, 155

[56] References Cited

U.S. PATENT DOCUMENTS 4,329,640 5/1982 Reiner et al. ..................... 324/73 R

OTHER PUBLICATIONS

Van Holten, C., "Test Digital Circuits . . . Driven by the Tested System's Clock", Electronic Design 21, vol. 25, Oct. 11, 1977, p. 210.

*Primary Examiner*—Gerard R. Strecker
*Attorney, Agent, or Firm*—Staas & Halsey

[57] ABSTRACT

An integrated circuit having a frequency-dividing circuit which can be tested at high speeds, in which the frequency-dividing circuit is separated into a first stage frequency-dividing circuit and a second stage frequency-dividing circuit, an output buffer circuit and a test signal input circuit are connected to an alarm terminal parallelly, and test signals applied to the alarm terminal are supplied to the second stage frequency-dividing circuit via the test signal input circuit and a switching circuit.

7 Claims, 5 Drawing Figures

INTEGRATED CIRCUIT WITH FREQUENCY-DIVIDING CIRCUITS CAPABLE OF BEING TESTED AT A HIGH SPEED

BACKGROUND OF THE INVENTION

The present invention relates to an integrated circuit with multi-stage frequency-dividing circuits. The integrated circuits according to the present invention can be used, for example, for driving analog type electronic clocks or watches.

FIG. 1 illustrates a conventional circuit for driving an analog type electronic clock. The 4.194304 MHz output of a quartz oscillator 11 is fed to a frequency-dividing circuit 12' which consists of 23 flip-flop circuits. The frequency-dividing circuit 12' divides the frequency by $2^{23}$, and produces a set of pulse trains having a frequency of 0.5 Hz and phases which are shifted by $\frac{1}{2}$ period. The pulse trains are fed to a pulse processing circuit 2 which produces an output for a motor drive circuit 5. The outputs of the motor drive circuit are fed from output terminals 8*a*, 8*b* to a step motor for driving the second hand, and to a time warning device (alarm) from an output terminal 7 via an output buffer 3. A reset signal for setting the time is fed to a reset terminal 6.

FIG. 2 illustrates signal waveforms obtained at the output terminals 8*a*, 8*b* of the motor drive circuit of FIG. 1. Namely, the output pulse produced at the terminal 8*a* and the output pulse produced at the terminal 8*b* have a period of 2 seconds, i.e., have a frequency of 0.5 Hz, and further have phases which are shifted by $\frac{1}{2}$ cycle relative to each other. Therefore, the motor performs one step motion per one second. The reset operation in the circuit of FIG. 1 is not effected ($\overline{RST}$) when the output pulses at the terminals 8*a*, 8*b* are of the high level, but is effected (RST) when the output pulses are of the low level. Further, in order for the motor to reliably operate after the reset has been effected, a pulse from the terminal opposite to that of the pulse that was fed at the time of effecting the reset is fed to the motor after the reset has been effected. That is, when the reset is effected after a pulse on the side 8*a* has been generated, a pulse on the side 8*b* is fed after the reset is completed. When the reset is effected after a pulse on the side 8*b* has been generated, a pulse on the side 8*a* is fed after the reset is completed. Here, the circuit of FIG. 1 is housed in a package having 8 pins, or leads. Among the 8 pins, 2 pins are used for the power supply, 2 pins are used for connection to the quartz crystal, 2 pins are used for driving the motor, 1 pin is used for effecting the resetting, and 1 pin is used for driving the alarm. Therefore, there are no extra pins.

In order to test the circuit of FIG. 1, one might consider using input terminals for introducing test signals, and feeding high-frequency test pulses through such terminals in order to effect the test within a short period of time. As mentioned above, however, there are no extra pins available for use as test terminals. Accordingly, a test utilizing the test signal input terminals cannot be conducted.

SUMMARY OF THE INVENTION

In view of the aforesaid problem inherent in the conventional circuit, the principal object of the present invention is to test an integrated circuit having a multi-stage frequency-dividing circuit at high speeds by feeding test signals to the frequency-dividing circuit without providing any additional test signal input terminals.

In accordance with the present invention, there is provided an integrated circuit including a frequency-dividing circuit for dividing an input frequency, a pulse processing circuit for processing the frequency that is divided by said frequency-dividing circuit, an output circuit for feeding the processed pulses to the load, and a reset signal receiving circuit, characterized in that said frequency-dividing circuit is separated into a first stage frequency-dividing circuit and a second stage frequency-dividing circuit, a switching circuit is inserted between these two circuits, a circuit is provided for supplying, through said switching circuit, the second stage frequency-dividing circuit with test signals applied to a predetermined pin of a plurality of pins of said integrated circuit, a means is provided for forcing an output buffer circuit connected to said predetermined pin to be high impedance by isolating it when a reset signal is fed to said reset signal receiving circuit, the reset being cancelled, and the second stage frequency-dividing circuit being actuated through said switching circuit when test signals are fed through said predetermined pin.

DESCRIPTION OF THE PREFERRED EMBODIMENTS

Figure 1:
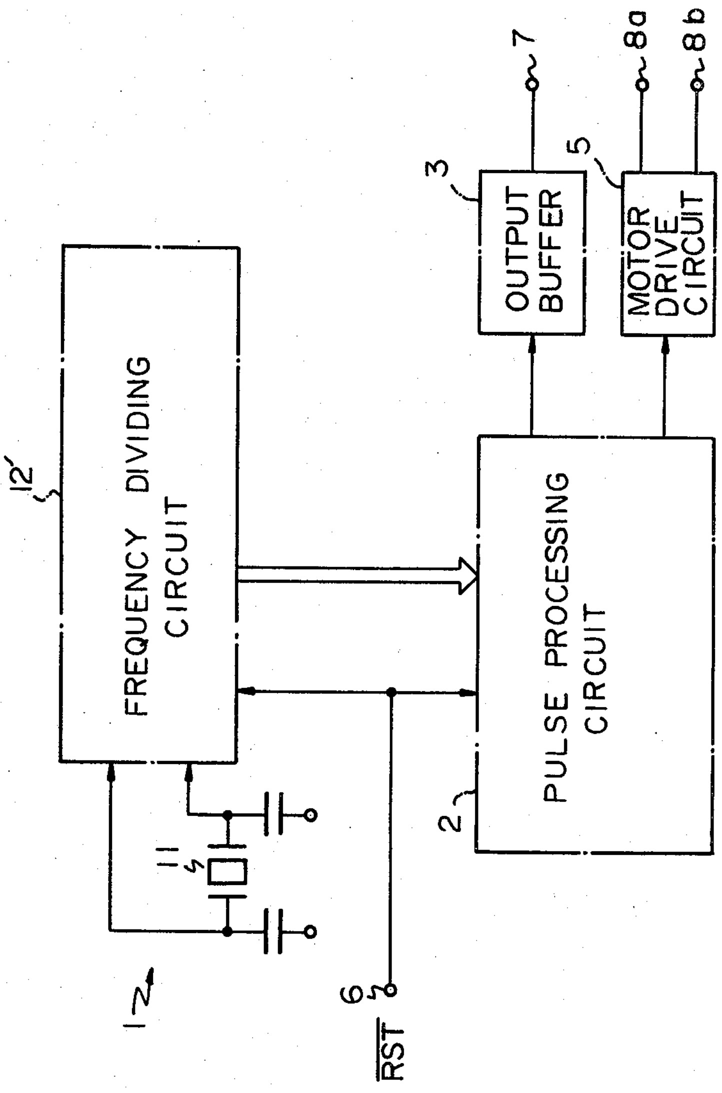
Fig. 1 PRIOR ART
FIG. 1 is a diagram illustrating a conventional circuit for driving an analog type electronic timekeeping device.
Figure 2:
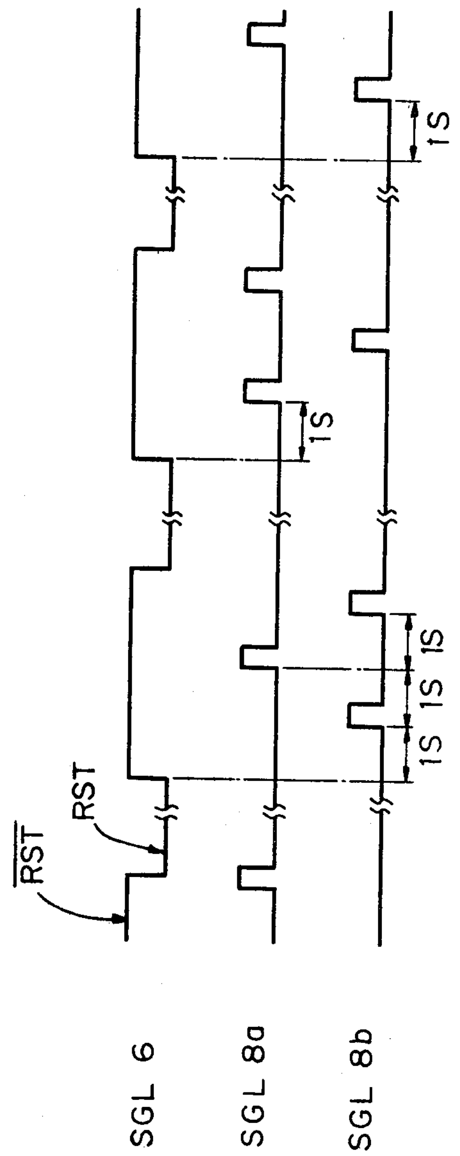
FIG. 2 is a diagram of waveforms showing two pulse trains produced by the circuit of FIG. 1 to drive an electric motor.
Figure 3:
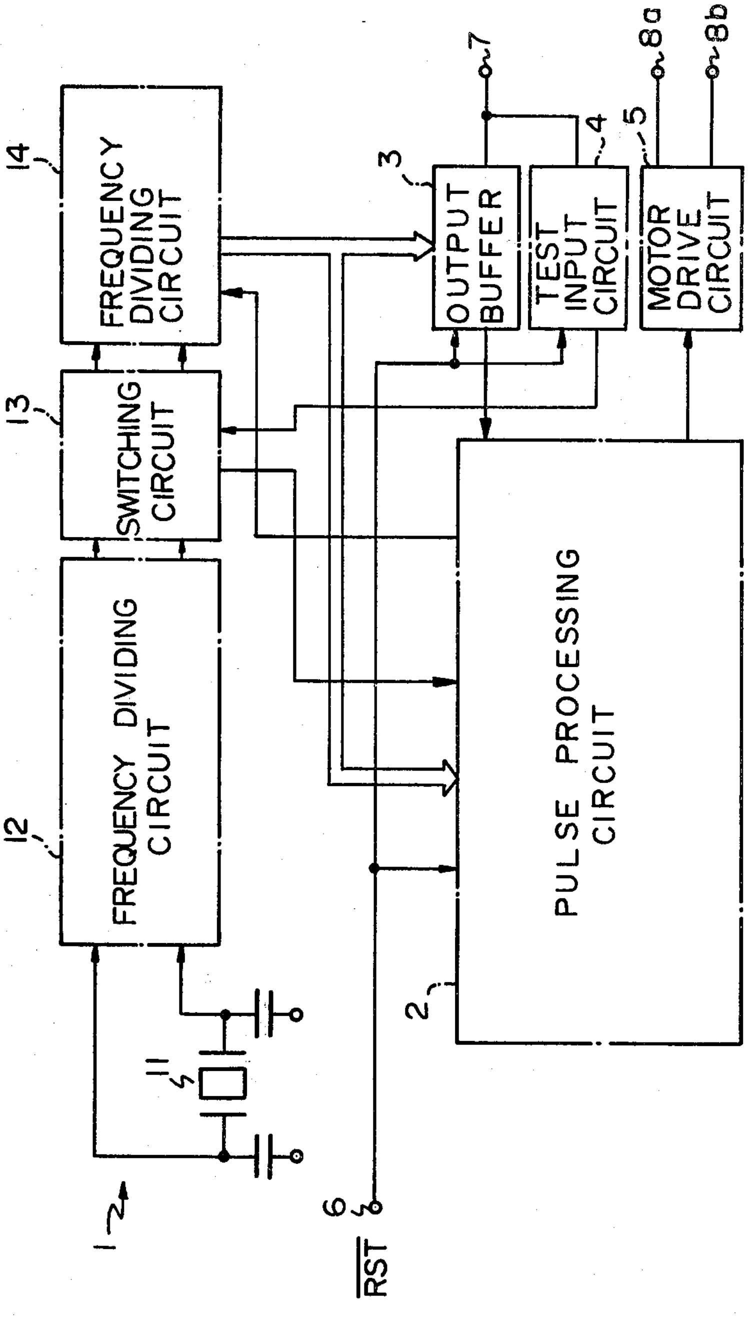
FIG. 3 is a diagram schematically illustrating an integrated circuit having a multi-stage frequency-dividing circuit according to an embodiment of the present invention.
Figure 4A:
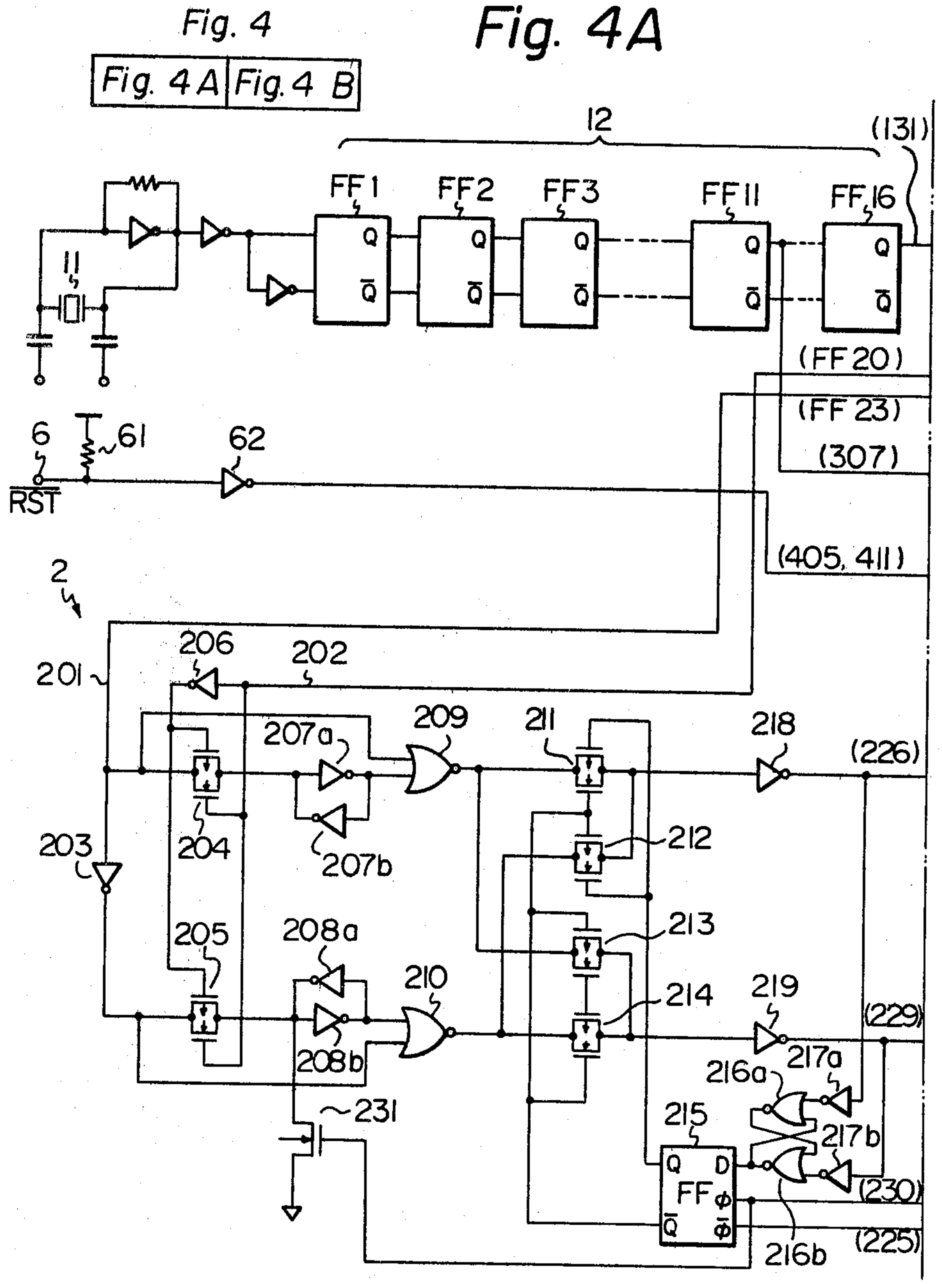
FIGS. 4A and 4B are diagrams illustrating in detail the circuit of FIG. 3.
Figure 4B:
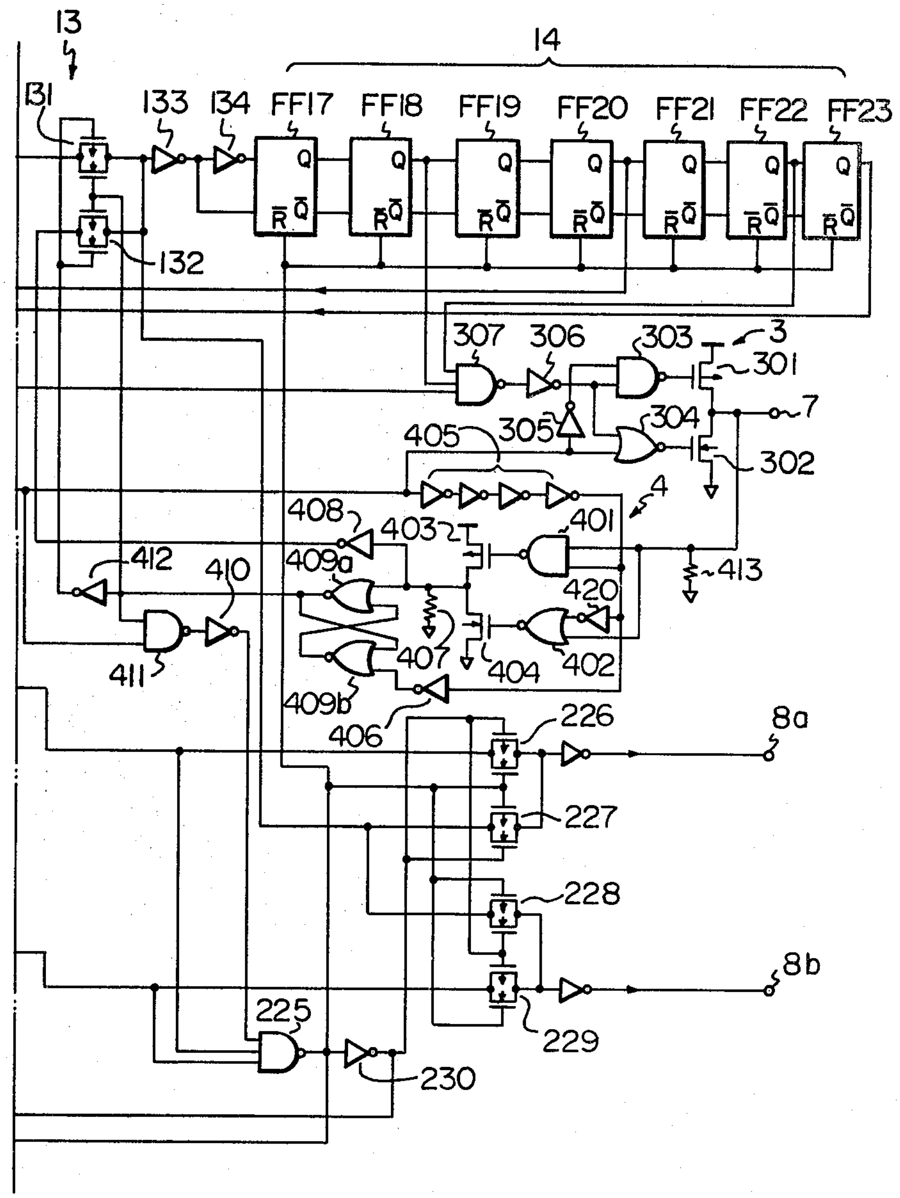

FIG. 3 illustrates an integrated circuit having a multi-stage frequency-dividing circuit according to an embodiment of the present invention. Detailed construction of the circuit of FIG. 3 is shown in FIG. 4. In the circuit of FIG. 3, the frequency-dividing circuit is separated into the first stage frequency-dividing circuit 12 and the second stage frequency-dividing circuit 14 which are connected together via a switching circuit 13. A test input circuit 4 is connected to an alarm output terminal so that test signals can be introduced from the output terminal 7 to test the integrated circuit. The output of the test input circuit 4 is fed to the switching circuit 13.

Referring to FIG. 4, the first stage frequency-dividing circuit 12 includes flip-flop circuits FF1, FF2, FF3,—FF16 which are connected in cascade, and the second stage frequency-dividing circuit 14 includes flip-flop circuits, FF17, FF18,—FF23 which are connected in cascade. If the oscillation frequency of the oscillator 11 is 4.194304 MHz, the output of FF11 has a frequency of 2048 Hz, the output of FF16 has a frequency of 64 Hz, the output of FF18 has a frequency of 16 Hz, the output of FF20 has a frequency of 4 Hz, and the output of FF23 has a frequency of 0.5 Hz. A pulse having a frequency of 0.5 Hz and a duty ratio of 50% is fed from FF23 to an input line 201 of a pulse processing circuit 2, and is applied to a NOR gate 209 and to a switch 204 which is constructed by connecting FETs parallelly. The output of the inverter 203 is applied to a NOR gate 210 and to a switch 205 which is constructed by connecting FETs parallelly. The switches 204 and 205 are actuated by pulses of a frequency of 4 Hz that are fed from FF20 via an input line 202. The outputs of the switches 204 and 205 are fed to holding circuits 207*a*, 207*b* and 208*a*, 208*b* which consist of inverters, and the outputs of the holding circuits are fed to NOR gates 209 and 210. The outputs of the NOR gates 209, 210 constitute two pulse trains having a frequency of 0.5 Hz and phases which are deviated by ½ cycle relative to each other.

The pulse trains are supplied to switches 211, 212, 213, 214, whereby the switching operations for the two pulse trains are effected. The switches 211, 212, 213 and 214 are controlled by the output of a flip-flop circuit 215. Upon receipt of a reset signal, the flip-flop circuit 215 operates together with latch circuits 216*a*, 216*b* to store the pulse output train, and permits a first pulse to be obtained from the other pulse output train after the reset has been completed.

When a reset signal is applied to a reset terminal 6, the output of an inverter 62 assumes a high level, and one of the inputs to a NAND gate 225 assumes the high level. However, when the input of either an inverter 218 or an inverter 219 is of the high level, i.e., when the output of either the inverter 218 or the inverter 219 is of the low level, the output of the NAND gate 225 is of the high level, and switches 226 and 229 are open. When the inputs to the inverters 218 and 219 are both of the low level, the inputs to the NAND gate 225 are all of the high level, the output of the NAND gate 225 is of the low level, and the switches 226 and 229 are closed, so that the electric motor stops. This means that when the inputs to the inverters 218 and 219 are of the high level, the electric motor does not stop even when reset signals are fed to the reset terminal 6; the step motion of the electric motor is maintained.

The latch circuits 216*a*, 216*b* introduce the outputs of inverters 218, 219 via inverters 217*a*, 217*b*. When the output of the inverter 218 is of the low level, the output of the inverter 217*a* assumes the high level, and the output of the inverter 217*b* assumes the low level, whereby the outputs of latch circuits 216*a*, 216*b* assume the high level and are fed as inputs D to the flip-flop circuit 215. In this case, when the output of the inverter 230 is changed from the high level to the low level, the output Q of the flip-flop 215 assumes the high level and the output $\overline{Q}$ assumes the low level, to close the FET switches 212, 213, and to open the FET switches 211, 214, thereby effecting the switching of the two pulse trains for driving the electric motor. When the output of the inverter 219 is of the low level, on the other hand, operation opposite to that mentioned above is carried out.

Due to the signal produced by the inverter 230, the FET 231 is rendered conductive, the outputs of the latch circuits 208*a*, 208*b* assume the high level, the output of the NOR gate 210 assumes the low level, and the output of the inverter 218 assumes the high level. Therefore, after the reset has been completed, pulses for driving the motor are reliably supplied from the other pulse train.

The outputs of the flip-flop circuits FF11, FF18 and FF22 are fed to a NAND gate 307 which produces outputs of intermittent waveforms as defined by frequencies 1 Hz, 16 Hz and 2048 Hz. The signals thus produced are fed to the alarm terminal 7 via inverter 306, NAND gate 303, NOR gate 304, FET switch 301 and FET switch 302, and are produced as alarm signals.

In the circuit of FIG. 3, a switching circuit 13 is inserted between the first stage frequency-dividing circuit 12 and the second stage frequency-dividing circuit 14, and the output buffer circuit 3 and the test signal input circuit 4 are connected to the alarm terminal 7. Referring to FIG. 4, the switching circuit 13 includes FET switches 131 and 132. The test signal input circuit 4 includes a NAND gate 401, an inverter 420, a NOR gate 402, FET buffers 403 and 404, latch circuits 409*a* and 409*b*, an inverter 412, and resistors 407 and 413. The output buffer circuit 3 includes FET buffers 301 and 302, a NAND gate 303, a NOR gate 304, inverters 305 and 306, and a NAND gate 307.

The circuit of FIG. 4 performs the operation which will be mentioned below when a reset signal is applied to the reset terminal 6 to reset the circuit and when a test signal is applied to the alarm terminal 7. Namely, the signal of the high level produced by the inverter 62 is delayed by an inverter group 405, and is fed to the NAND gate 401 and to the NOR gate 402 via inverter 420, so that the outputs of the NAND gate 401 and the NOR gate 402 are determined by the input signal from the alarm terminal 7. The high level signal produced by the inverter 62 passes through the inverter group 405 and the inverter 406, and is fed as a low level signal to the latch circuits 409*a* and 409*b*. When the test signal fed to the alarm terminal 7 is of the high level, the output of the NAND gate 401 assumes the low level, the output of the NOR gate 402 assumes the low level, FET 403 is turned on, FET 404 is turned off, and latch circuits 409*a*, 409*b* produce low level signals. Responsive to the low level signals produced by the latch circuits 409*a*, and 409*b*, the FET switch 131 is opened and the FET switch 132 is closed. At the same time, the outputs of the FET buffers 403 and 404 are applied to the flip-flop circuit FF17 via the inverter 408 and the switch 132. The low level signal produced by the latch circuits 409*a*, 409*b* are applied to the NAND gate 411; the output of the NAND gate 411 assumes the high level, the output of the inverter 410 assumes the low level, and the output of the NAND gate 225 assumes the high level. Accordingly, the FET switches 226 and 229 are closed, and the FET switches 227 and 228 are opened. Hence, the output signals of the inverters 218, 219 are fed to terminals 8*a*, 8*b* for feeding motor drive signals, and the supply of 64 Hz signals from the flip-flop circuit FF16 is interrupted. As the inverter 410 produces a low level signal, the flip-flop circuits FF17 to FF23 are liberated from being reset.

Under this condition, the device of FIG. 4 can be tested by test signals that are supplied through the alarm terminal 7. Namely, the flip-flop circuits FF17 to FF23 which constitute the second stage frequency-dividing circuit start to count the test signals, and a circuit including FET switches 204 and 205 prepare motor drive pulses responsive to the signals that are based upon the counted results, and the motor drive pulses are produced through FET switches 226 and 229. The signals thus produced are measured at the output terminals 8*a*, 8*b*. By measuring the signals, it is possible to check the period of the output signal pulses, the width of the pulses and the difference in phases. It is further possible to check whether the pulse is produced from the pulse train of the other side or not when the reset has been completed. These checks can be performed within a short period of time since the output pulse signals have a high frequency. The reason is because, if the test signals applied to the alarm terminal 7 have a frequency of 2 MHz, the first flip-flop circuit 17 in the second stage frequency-dividing circuit is served with the signals of 2 MHz. When the circuit is ordinarily operating, the output frequency of 64 Hz of the first stage frequency-dividing circuit is fed to the flip-flop circuit FF17. When the circuit is to be tested, therefore, a frequency which is greater by the ratio of these frequencies, 2 MHz/64 Hz, is applied. When the circuit is being tested, therefore, an operation speed of about $3.12\times10^4$ times of that of the ordinary operation is obtained. The test signals from the alarm terminal are not applied to the first stage frequency-dividing circuit 12. Therefore, the first stage frequency-dividing circuit 12 is tested by the signals from the oscillator 11. In the device of FIG. 3, however, it is important to test the second stage frequency-dividing circuit 14 rather than the first stage frequency-dividing circuit 12. Accordingly, the testing system of the present invention is very useful.

The foregoing description has dealt with the case when the oscillator 11 has a frequency of 4.194304 MHz and the second stage frequency-dividing circuit produces a frequency of 0.5 Hz. The frequencies, however, need not be limited to the above values only, but may assume any other values.

What we claim is:

1. An improved integrated circuit of the type which has a plurality of pins and which includes a frequency-dividing circuit for dividing an input signal, a pulse processing circuit for processing the signal that is divided by said frequency-dividing circuit to produce processed pulses, an output circuit for feeding the processed pulses through at least one first pin to a load, said pulse processing circuit including a reset signal receiving circuit, for discontinuing the transfer of processed pulses to the load following receipt of a reset signal applied to a second pin, and an output buffer circuit connected between said frequency-dividing circuit and a third pin, wherein the improvement comprises:

testing means responsive to a test signal applied to said third pin while said reset signal is applied to said second pin for introducing said test signal at an intermediate point in said frequency-dividing circuit, said intermediate point dividing said frequency-dividing circuit into first stage and second stage frequency-dividing circuits, and for permitting transfer of processed pulses to said at least one first pin despite the presence of said reset signal at said second pin, in order to permit testing of said second stage frequency-dividing circuit, said pulse processing circuit, and said output circuit, said testing means including a switching circuit inserted between the first stage and second stage frequency-dividing circuits;

test input circuit means having an input connected to said third pin for supplyiing said test signals through said switching circuit to the second stage frequency-dividing circuit; and means included within said output buffer circuit for isolating said output buffer circuit from said third pin when a reset signal is fed through said second pin to said reset signal receiving circuit.

2. A circuit according to claim 1, wherein said third pin is a pin for delivering alarm signals.

3. A circuit according to claim 1 or claim 2, wherein the output buffer circuit connected to said third pin comprises a transistor switching element, a gate element having an output connected to the input of said transistor switching element, and an inverter having an output connected to the input of said gate element.

4. A circuit according to claim 3, wherein said test input circuit means comprises: A NAND gate having a first input connected to said third pin and having a second input responsive to said reset signal receiving circuit; a NOR gate having a first input connected to the first input of the NAND gate and having a second input; a first inverter having an input connected to the second input of the NAND gate and an output connected to the second input of the NOR gate; first and second FET's series-connected at an intermediate connection point, the gates of the first and second FET's being connected respectively to the outputs of the NAND and NOR gates; and a latch circuit having an input connected to the intermediate connection point and an output connected to the switching circuit.

5. A circuit according to claim 4, wherein said switching circuit comprises: first and second FET switches each including a pair of FET's connected in parallel.

6. A circuit according to claim 5, wherein the load is a motor for a analog chromometer and said package has eight pins, said output buffer circuit connecting an alarm circuit to said third pin.

7. A circuit according to claim 6, wherein the first stage frequency-dividing circuit comprises sixteen cascade-connected flip-flops and the second stage frequency dividing circuit comprises seven cascade-connected flip-flops.

* * * * *